United States Patent
Shenouda

(10) Patent No.: US 12,196,800 B2
(45) Date of Patent: Jan. 14, 2025

(54) SENSOR FOR ARC DETECTION

(71) Applicant: Pratt & Whitney Canada Corp., Longueuil (CA)

(72) Inventor: Antwan Shenouda, Mississauga (CA)

(73) Assignee: PRATT & WHITNEY CANADA CORP., Québec (CA)

( * ) Notice: Subject to any disclaimer, the term of this patent is extended or adjusted under 35 U.S.C. 154(b) by 142 days.

(21) Appl. No.: 18/180,574

(22) Filed: Mar. 8, 2023

(65) Prior Publication Data

US 2024/0302424 A1    Sep. 12, 2024

(51) Int. Cl.
*G01R 31/12* (2020.01)
*G01R 31/52* (2020.01)
*H02H 1/00* (2006.01)

(52) U.S. Cl.
CPC ......... *G01R 31/1218* (2013.01); *G01R 31/52* (2020.01); *H02H 1/0023* (2013.01)

(58) Field of Classification Search
CPC  G01R 31/1218; G01R 31/52; G01R 31/1272; H02H 1/0023; H02H 1/0015; H01H 85/0039
USPC ........................................ 324/537, 501, 500
See application file for complete search history.

(56) References Cited

U.S. PATENT DOCUMENTS

| 4,658,322 | A | 4/1987 | Rivera |
| 8,054,594 | B2 | 11/2011 | Wu et al. |
| 10,193,331 | B2 | 1/2019 | Kilroy et al. |
| 10,663,509 | B2 * | 5/2020 | Meyer .................... G01R 31/52 |
| 11,171,474 | B2 * | 11/2021 | Ionescu ................ H02H 1/0015 |
| 2008/0225445 | A1 | 9/2008 | Cheng et al. |
| 2023/0384398 | A1 * | 11/2023 | Takahashi .............. G01R 31/58 |

FOREIGN PATENT DOCUMENTS

| CA | 2869805 C | 5/2017 |
| DE | 102020210646 A1 | 2/2022 |
| FR | 3080684 A1 | 11/2019 |
| KR | 101542538 B1 | 8/2015 |

OTHER PUBLICATIONS

Search Report issued in European Patent Application No. 24161863.6; Application Filing Date Mar. 6, 2024; Date of Mailing Jul. 18, 2024 (8 pages).

* cited by examiner

*Primary Examiner* — Giovanni Astacio-Oquendo
(74) *Attorney, Agent, or Firm* — CANTOR COLBURN LLP

(57) ABSTRACT

An arc detection assembly is provided and includes a first conductor comprising a first terminal end, a second conductor comprising a second terminal end, an enclosure to partially enclose a space in which the first and second terminal ends are engageable to form an electrical connection and an optical detection system. The optical detection system includes an optical element within the enclosure with a line-of-sight to an engagement of the first and second terminal ends and a sensor. The sensor is displaced from the enclosure and coupled to the optical element. The sensor is configured to determine when the optical element senses an arcing condition between the first and second terminal ends.

20 Claims, 5 Drawing Sheets

SENSOR FOR ARC DETECTION

BACKGROUND

The present disclosure relates to arc detection and, in particular, to a sensor for arc detection.

An arc fault is a high-power discharge of electricity between two or more conductors. This discharge generates heat, which can break down the wire's insulation and trigger an electrical fire. Arc faults can range in current from a few amps up to thousands of amps, and are highly variable in strength and duration.

SUMMARY

According to an aspect of the disclosure, an arc detection assembly is provided and includes a first conductor comprising a first terminal end, a second conductor comprising a second terminal end, an enclosure to partially enclose a space in which the first and second terminal ends are engageable to form an electrical connection and an optical detection system. The optical detection system includes an optical element within the enclosure with a line-of-sight to an engagement of the first and second terminal ends and a sensor displaced from the enclosure and coupled to the optical element. The sensor is configured to determine when the optical element senses an arcing condition between the first and second terminal ends.

In accordance with additional or alternative embodiments, the first and second terminal ends are engageable in at least one of a pin-and-socket formation and a terminal lug formation.

In accordance with additional or alternative embodiments, the optical element includes a lens configured to receive arc light from multiple angles.

In accordance with additional or alternative embodiments, the sensor includes at least one of an optical sensor, an infrared sensor and an ultraviolet sensor.

In accordance with additional or alternative embodiments, the sensor is a component of a controller, the controller being configured to identify and interrupt an arc causing current and to issue an arcing warning and the arc detection assembly further includes an electrical device configured to open a circuit carrying the current responsive to an interrupt signal issued by the controller.

In accordance with additional or alternative embodiments, the optical detection system includes a fiber optic cable routed along at least one of the first and second conductors and by which the optical element and the sensor are communicative.

According to an aspect of the disclosure, an arc detection assembly is provided and includes electrical connections and an optical detection system. Each electrical connection includes a first conductor including a first terminal end, a second conductor including a second terminal end and an enclosure to partially enclose a space in which the first and second terminal ends are engageable to form an electrical connection. The optical detection system includes optical elements, each within one of the enclosures with a line-of-sight to an engagement of the corresponding first and second terminal ends, a sensor displaced from the enclosures and coupled to each of the sensors and configured to determine when any of the optical elements senses an arcing condition between the corresponding first and second terminal ends and a fiber optic cable routed along at least one of the first and second conductors of each of the electrical connections and by which each of the optical elements and the sensor are communicative.

In accordance with additional or alternative embodiments, the first and second terminal ends in at least one of the electrical connections are engageable in at least one of a pin-and-socket formation and a terminal lug formation.

In accordance with additional or alternative embodiments, each of the optical elements includes a lens configured to receive arc light from multiple angles.

In accordance with additional or alternative embodiments, the sensor includes at least one of an optical sensor, an infrared sensor and an ultraviolet sensor.

In accordance with additional or alternative embodiments, the sensor is a component of a controller, the controller being configured to identify and interrupt an arc causing current and to issue an arcing warning and the arc detection assembly further includes an electrical device configured to open a circuit carrying the current responsive to an interrupt signal issued by the controller.

In accordance with additional or alternative embodiments, electrical elements are electrically interposed between the fiber optic cable and a corresponding one of the optical elements and are configured to identify the corresponding one of the optical elements to the sensor.

According to an aspect of the disclosure, an arc detection assembly is provided and includes electrical connections and an optical detection system. Each electrical connection includes a first conductor including a first terminal end, a second conductor including a second terminal end and an enclosure to partially enclose a space in which the first and second terminal ends are engageable to form an electrical connection. The optical detection system includes optical elements, each within one of the enclosures with a line-of-sight to an engagement of the corresponding first and second terminal ends, and a sensor displaced from the enclosures and coupled to each of the sensors. The sensor is configured to determine when any of the optical elements senses an arcing condition between the corresponding first and second terminal ends.

In accordance with additional or alternative embodiments, the first and second terminal ends in at least one of the electrical connections are engageable in at least one of a pin-and-socket formation and a terminal lug formation.

In accordance with additional or alternative embodiments, each of the optical elements includes a lens configured to receive arc light from multiple angles.

In accordance with additional or alternative embodiments, the sensor includes at least one of an optical sensor, an infrared sensor and an ultraviolet sensor.

In accordance with additional or alternative embodiments, the sensor is a component of a controller, the controller being configured to identify and interrupt an arc causing current and to issue an arcing warning and the arc detection assembly further includes an electrical device configured to open a circuit carrying the current responsive to an interrupt signal issued by the controller.

In accordance with additional or alternative embodiments, the optical detection system includes fiber optic cables each connected to a corresponding one of the optical elements and each of the fiber optic cables is routed along at least one of the corresponding first and second conductors.

In accordance with additional or alternative embodiments, each of the optical elements is communicative with a unique channel of the sensor by way of the corresponding one of the fiber optic cables.

In accordance with additional or alternative embodiments, each of the optical elements is communicative with the sensor by way of the corresponding one of the fiber optic cables and each of the fiber optic cables is connected to a same channel of the sensor and comprises an electrical element configured to identify the corresponding one of the optical elements to the sensor.

Additional features and advantages are realized through the techniques of the present disclosure. Other embodiments and aspects of the disclosure are described in detail herein and are considered a part of the claimed technical concept. For a better understanding of the disclosure with the advantages and the features, refer to the description and to the drawings.

BRIEF DESCRIPTION OF THE SEVERAL VIEWS OF THE DRAWINGS

For a more complete understanding of this disclosure, reference is now made to the following brief description, taken in connection with the accompanying drawings and detailed description, wherein like reference numerals represent like parts.

DETAILED DESCRIPTION

Figure 1:
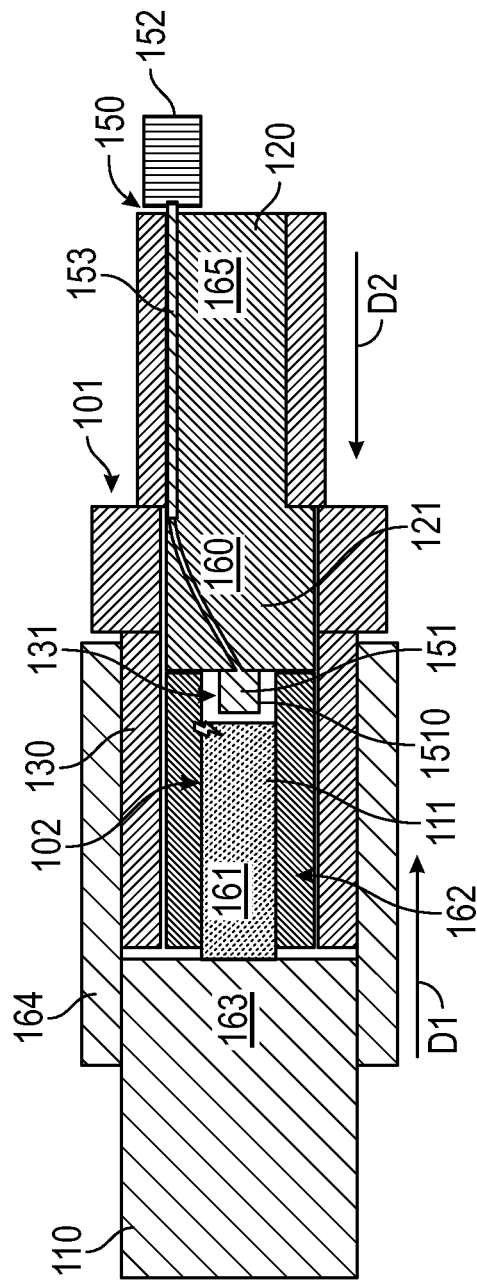
FIG. 1 is a schematic side view of an arc detection assembly and a pin-and-socket formation in accordance with embodiments.

A parallel arc occurs when electricity intermittently jumps a gap between wires of different voltages, such as line-to-line (i.e., two hot conductors of different phases), line-to-neutral or line-to-ground. An example of what may cause a parallel arc is contamination that bridges the gap between two parallel lines of different voltages, or if damage occurs on the insulation of two parallel lines carrying different voltages, where the damaged lines are close enough together, an arc may occur between the exposed wires. Since parallel arcs occur between conductors at different voltages, the amount of current can vary widely, from very little to a very high amount up to the short circuit current available for that circuit. A series arc occurs when electricity intermittently jumps a gap between two or more points within the same phase. An example of what may cause a series arc is when a pin and socket connection are not tightly fit, or connection may intermittently break due to vibration, etc.

An airgap distance that an arc can jump depends on the voltage and the altitude (resulting air pressure). The lower the altitude, and the higher the voltage, the larger the distance that the arc can jump.

Arcs can also occur when a nonconductive medium, such as air, breaks down and creates an electrical path from a high energy source and a lower energy sink.

An AC arc can be cleared easier than a DC gap because the current and voltage are forced to go through zero multiple times a second (depending on the frequency). DC arcs can be sustained at much larger distances from the original distance at formation because a conductive channel is formed once the arc is created.

Current methods of arc detection include electromagnetic interference (EMI) detection, audio detection, current signature analysis and optical detection. The present methods generally attempt to isolate an arc signature (audio, optical, EMI or current) from the surrounding environment. This can prove to be very difficult for high voltage/power lines because the current flowing in the cables and the surrounding equipment can contribute significant noise. For example, the current in a conductor driving a motor can be very noisy electrically because of multiple factors, such as high-power switching. Optical detection methods suffer from the fact that, while light travels in straight lines, light is relatively easily attenuated. As such, optical detection methods often require multiple optical sensors and a completely dark environment to be able to detect arcing.

Therefore, there remains a need for simple and reliable methods and systems for detecting high impedance arcing.

Thus, as will be described below, arc detection in a semi-enclosed or enclosed space, such as an electronic box or a terminal box, is provided by an addition of fiber optic lines to potential arc sources and routing the fiber optic lines to an optical sensor. This allows for the detection of parallel arcs as well as serial arcs, which occur between serially connected conductors and which are often very difficult to detect.

With reference to FIG. 1, an arc detection assembly 101 is provided and includes a first conductor 110 that includes a first terminal end 111, a second conductor 120 that includes a second terminal end 121, an enclosure 130 and an optical detection system 150. The enclosure 130 is formed to fully or at least partially enclose a space 131 in which the first and second terminal ends 111 and 121 are engageable with one another to form an electrical connection 102 by which current is conducted from the first conductor 110 to the second conductor 120 (or vice versa; for purposes of clarity and brevity, unless otherwise noted, the following description will relate to cases in which current is conducted from the first conductor 110 to the second conductor 120).

The optical detection system 150 is configured to sense, detect and, in some cases, mitigate an arcing condition (i.e., an arc that is occurring or a potential arc that is about to occur) between the first conductor 110 and the second conductor 120. In particular, the optical detection system 150 is configured to sense, detect and, in some cases, mitigate an arcing condition (i.e., an arc that is occurring or a potential arc that is about to occur) between the first terminal end 111 and the second terminal end 121 as the first and second terminal ends 111 and 121 engage to form the electrical connection 102 or while the first and second terminal ends 111 and 121 are engaged.

In the case of the potential arc that is about to occur, a local temperature rise can occur due to increasing impedance at the potential arc location. This rise in temperature can be sensed directly (i.e., by the optical detection system 150 having a temperature sensing capability) or optically (i.e., by the optical detection system 150 having infrared sensing capability).

The optical detection system 150 includes an optical element 151, a sensor 152 and a fiber optic cable 153. The optical element 151 is disposable within the enclosure 130 with a line-of-sight to an engagement of the first and second terminal ends 111 and 121. In this way, the enclosure 130 eliminates or substantially reduces ambient light within the space 131 and thus increases a reliability of the optical element 151 to sense when an arc occurs or is about to occur (i.e., by reducing noise and/or false positive events). The optical element 151 can include or be provided as a lens 1510 that is configured to receive arc light from multiple angles which increases a field-of-view of the optical element 151. The sensor 152 is displaced from the enclosure 130 and is operably coupled to and communicative with the optical element 151 by way of the fiber optic cable 153, which is routed along and, in some cases, through at least one of the first and second conductors 110 and 120. The sensor 152 is configured to determine when the optical element 151 senses an arc between the first and second conductors 110 and 120 and/or between the first and second terminal ends 111 and 121. The sensor 152 can include or be provided as at least one of an optical sensor, an infrared sensor and an ultraviolet sensor. The sensor 152 can include a memory unit, a processor and an input/output (I/O) unit by which the processor is communicative with the optical element 151 and with an external device. The memory unit has executable instructions stored thereon, which are readable and executable by the processor. When the executable instructions are read and executable by the processor, the processor is caused to operate as described herein.

When an arc occurs or is about to occur between the first and second conductors 110 and 120 and/or between the first and second terminal ends 111 and 121, the optical element 151 senses or receives radiation generated by the arc or potential arc (i.e., visible light, infrared, ultraviolet, etc.) whereby a signal travels along the fiber optic cable 153 from the optical element 151 to the sensor 152. The sensor 152 receives the signal and (the processor) analyzes the signal and determines whether the signal is indicative of arcing, noise, ambient light, etc. If it is determined that the signal is indicative of a non-arcing event, the sensor 152 may take no action. If it is determined that the signal is indicative of an arcing event, the sensor 152 may take one or more actions. These include, but are not limited to, identifying a current that is responsible for causing the arc (i.e., by identifying the optical element 151 and recognizing that the optical element 151 may be associated with a given current), interrupting the current and issuing a warning that the arc occurred to the external device or to an operator for example.

Figure 2:
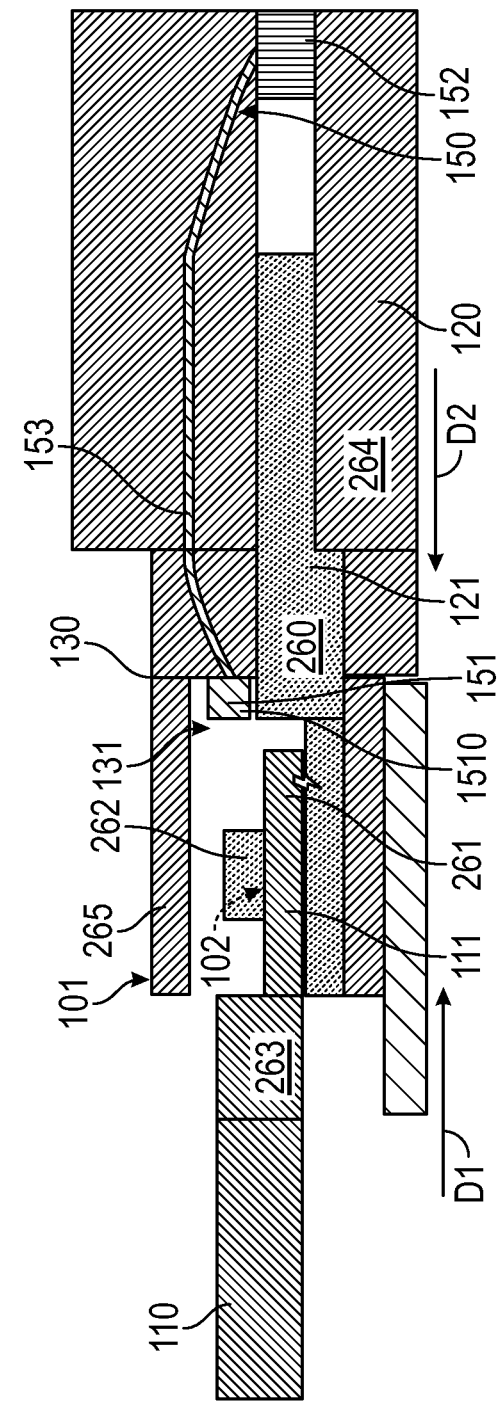
FIG. 2 is a schematic side view of an arc detection assembly and a bolt and busbar combination formation in accordance with embodiments.

With continued reference to FIG. 1 and with additional reference to FIG. 2, the first and second terminal ends 111 and 121 can be engageable in at least one of a pin-and-socket formation 160 (see FIG. 1) and a terminal lug formation 260 (see FIG. 2).

As shown in FIG. 1, the pin-and-socket formation 160 can be characterized in that the first terminal end 111 is provided as one or more pins 161 and in that the second terminal end 121 is provided as one or more sockets 162 (for purposes of clarity and brevity, the following description will relate to the case in which the first terminal end 111 is provided as a single pin 161 and the second terminal end 121 is provided as a single socket 162). The pin 161 extends from a connector element 163 (i.e., the first conductor 110) in a first direction D1 and the connector element 163 includes an outer sheath 164. The socket 162 extends from a cable 165 (i.e., the second conductor 120) in a second direction D2, which is opposite the first direction D1, and is formed to tightly fit around the pin 161. The outer sheath 164 is formed to tightly fit around a portion of the enclosure 130 that in turn is formed to tightly fit around the socket 162. In this case, the optical element 151 and the lens 1510 can be disposable in a region (i.e., the space 131) between the end of the pin 161 and the corresponding end of the cable 165 so that the optical element 151 and the lens 1510 have a line-of-sight to an engagement of the pin 161 and the socket 162. The fiber optic cable 153 can be routed from the optical element 151 and through or around the cable 165.

As shown in FIG. 2, the terminal lug formation 260 can be characterized in that the first terminal end 111 is provided as a terminal lug 261 and in that the second terminal end 121 is provided as a bolt and busbar combination 262 in which a bolt secures the terminal lug 261 to a busbar so that the terminal lug 261 is electrically connected with at least the busbar. The terminal lug 261 extends from a cable 263 (i.e., the first conductor 110) in a first direction D1. The bolt and busbar combination 262 is electrically connected to an electronic unit 264 (i.e., the second conductor 120) and in a second direction D2, which is opposite the first direction D1. The enclosure 130 includes a backshell 265 that generally surrounds the terminal lug 261 and the bolt and busbar combination 262. In this case, the optical element 151 and the lens 1510 can be disposable in a region (i.e., space) within the backshell 265 so that the optical element 151 and the lens 1510 have a line-of-sight to an engagement of the terminal lug 261 and the bolt and busbar combination 262. The fiber optic cable 153 can be routed from the optical element 151 and through or around the enclosure 130.

Figure 3:
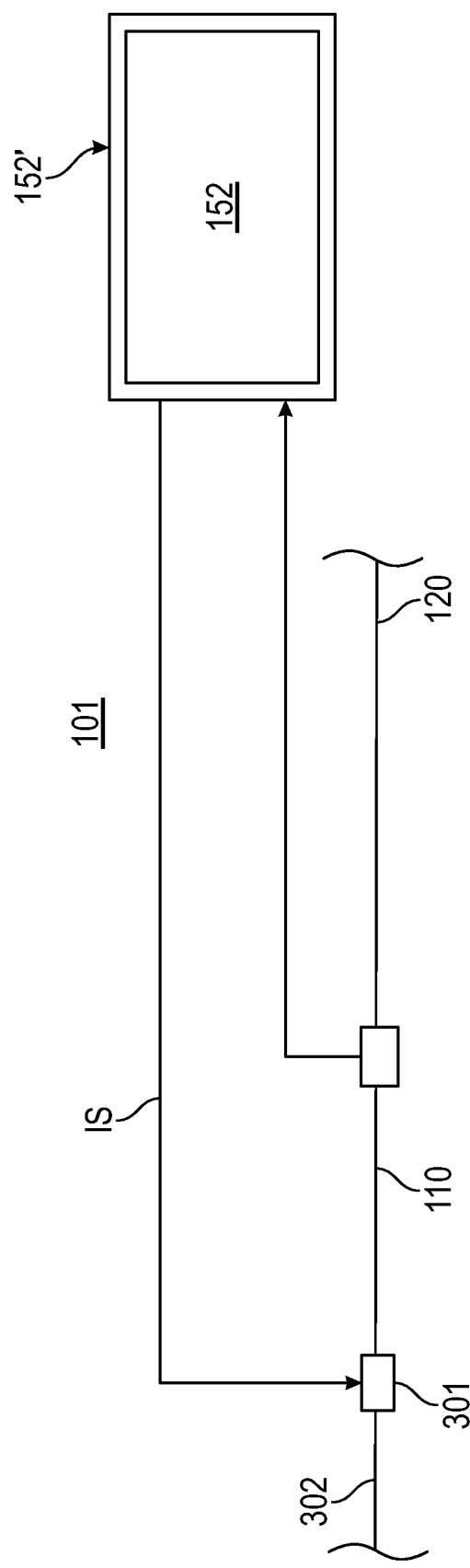
FIG. 3 is a circuit diagram including a controller and an electrical device of an arc detection assembly in accordance with embodiments.

With reference to FIG. 3, the sensor 152 can be provided as a component of a controller 152' with the controller 152' being configured to identify and interrupt a current causing arc and to issue an arcing warning. In these or other cases, the arc detection assembly 101 can further include an electrical device 301. The electrical device 301 can include or be provided as a contactor, a relay, a switch, etc. In any case, the electrical device 301 is configured to open a circuit 302 carrying the current in response to an interrupt signal IS issued by the controller 152'.

The following further descriptions of the arc detection assembly 101 will generally relate to the embodiments of FIG. 1 in which the first and second terminal ends 111 and 121 are engageable in the pin-and-socket formation 160 and elements and features that have already been described will not be re-described in detail. This is being done for purposes of clarity and brevity.

Figure 4:
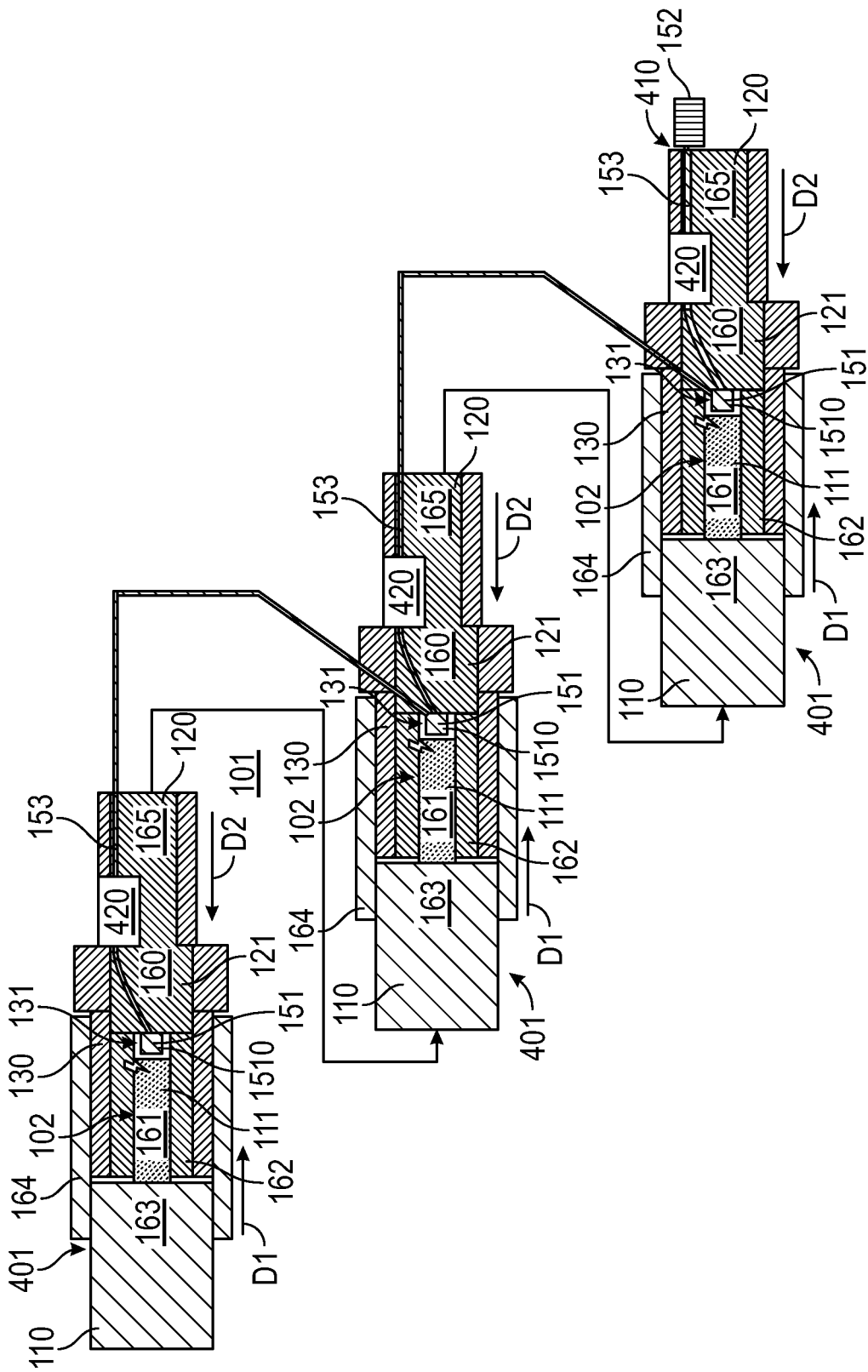
FIG. 4 is a schematic side view of the arc detection assembly of FIG. 1 with multiple electrical connections in a pin-and-socket formation in accordance with embodiments.

With reference to FIG. 4, the arc detection assembly 101 can include multiple electrical connections 401 and an optical detection system 410. Each of the multiple electrical connections 401 includes first and second conductors 110 and 120, first and second terminal ends 111 and 121 and an enclosure 130 to partially enclose a space 131 in which the first and second terminal ends 111 and 121 are engageable to form an electrical connection 102. The optical detection system 410 includes optical elements 151, each within one of the enclosures 130 with a line-of-sight to an engagement of the corresponding first and second terminal ends 111 and 121, a sensor 152 displaced from the enclosures 130 and coupled to each of the optical elements 151 and configured to determine when any of the optical elements 151 senses or is about to sense an arc between the corresponding first and second terminal ends 111 and 121 and a fiber optic cable 153. The fiber optic cable 153 is routed along at least one of the first and second conductors 110 and 120 of each of the electrical connections 401. Each of the optical elements 151 and the sensor 152 are communicative by way of the fiber optic cable 153.

As shown in FIG. 4, the arc detection assembly 101 can further include electrical elements 420 that are electrically interposed between the fiber optic cable 153 and a corresponding one of the optical elements 151. Each of the electrical elements 420 can be provided as a filter or a similar device and is configured to identify the corresponding one of the optical elements 151 to the controller 152. For example, if it is assumed that any arc in any of the electrical connections 501 will generate visible light in a common set of wavelengths, each electrical element 420 can be a filter that filters out a subset of those wavelength. Thus, when a signal of a potential arcing event is transmitted from one of the optical elements 151 to the sensor 152, the corresponding electrical element 420 will filter out the subset of the wavelengths and the resulting filtered signal will allow the sensor 152 to identify the optical element 151 that sensed the potential arcing event.

Figure 5:
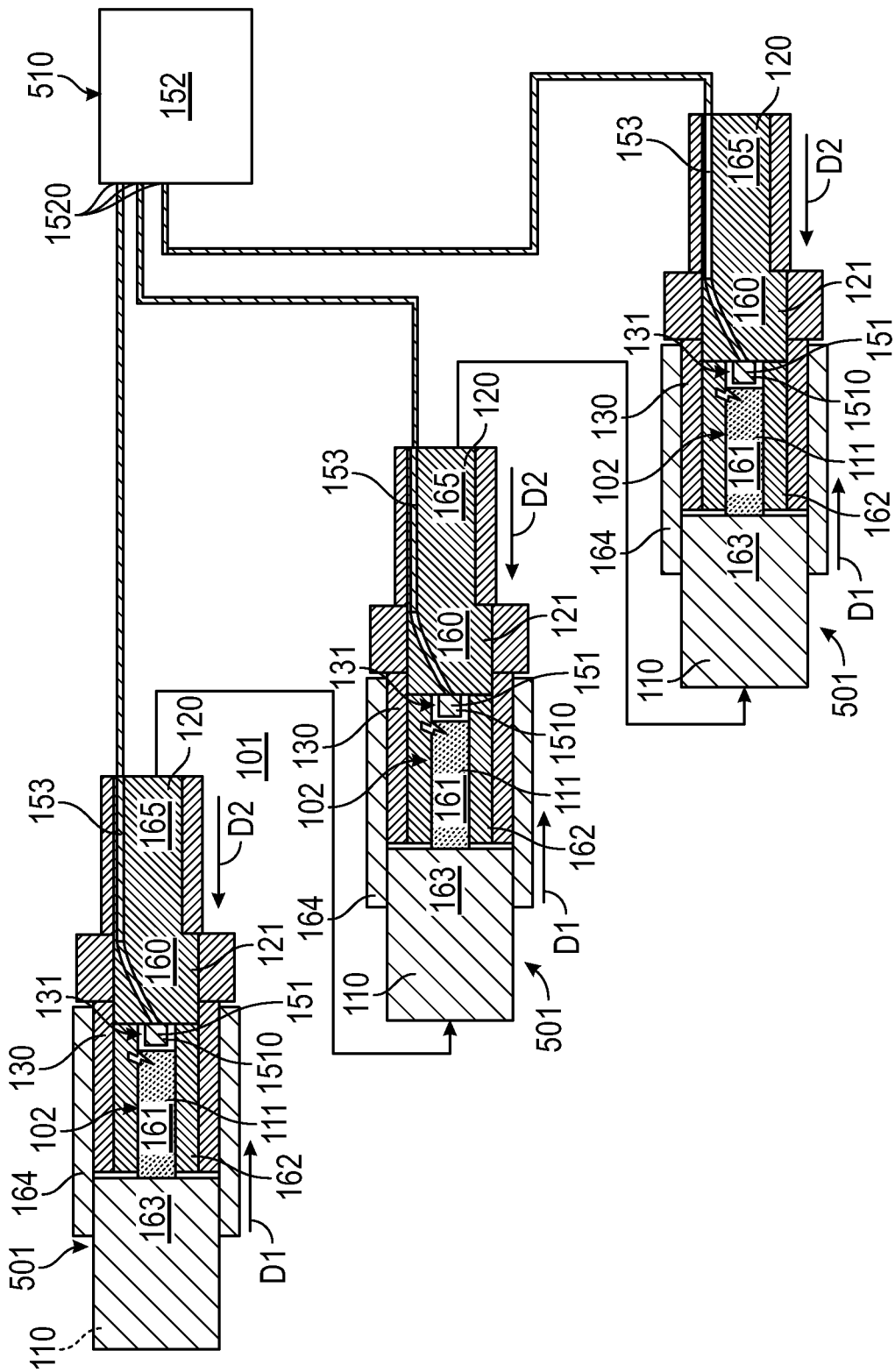
FIG. 5 is a schematic side view of the arc detection assembly of FIG. 1 with multiple electrical connections in a pin-and-socket formation and a fiber optic cable in accordance with embodiments.

With reference to FIG. 5, the arc detection assembly 101 can include multiple electrical connections 501 and an optical detection system 510. Each of the multiple electrical connections 501 includes first and second conductors 110 and 120, first and second terminal ends 111 and 121 and an enclosure 130 to partially enclose a space 131 in which the first and second terminal ends 111 and 121 are engageable to form an electrical connection 102. The optical detection system 510 includes optical elements 151, each within one of the enclosures 130 with a line-of-sight to an engagement of the corresponding first and second terminal ends 111 and 121, a sensor 152 displaced from the enclosures 130 and coupled to each of the optical elements 151 and configured to determine when any of the optical elements 151 senses or is about to sense an arc between the corresponding first and second terminal ends 111 and 121 and fiber optic cables 153. Each of the fiber optic cables 153 is connected to a corresponding one of the optical elements 151 and is routed along at least one of the corresponding first and second conductors 110 and 120. As shown in FIG. 5, each of the optical elements 151 is communicative with a unique channel 1520 of the sensor 152 by way of the corresponding one of the fiber optic cables 153.

Figure 6:
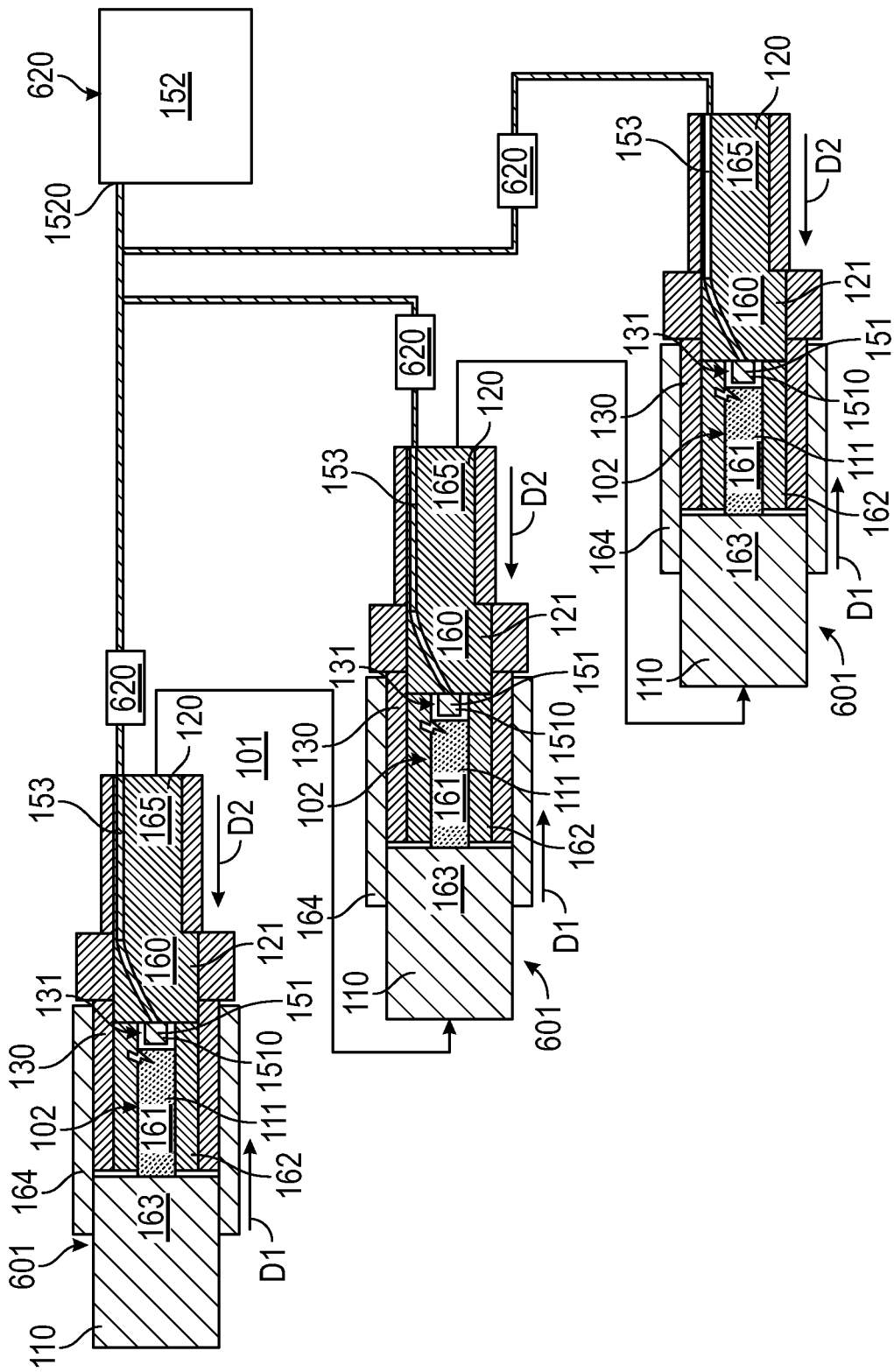
FIG. 6 is a schematic side view of the arc detection assembly of FIG. 1 with multiple electrical connections in a pin-and-socket formation and multiple fiber optic cables in accordance with embodiments.

With reference to FIG. 6, the arc detection assembly 101 can include multiple electrical connections 601 and an optical detection system 610. Each of the multiple electrical connections 601 includes first and second conductors 110 and 120, first and second terminal ends 111 and 121 and an enclosure 130 to partially enclose a space 131 in which the first and second terminal ends 111 and 121 are engageable to form an electrical connection 102. The optical detection system 610 includes optical elements 151, each within one of the enclosures 130 with a line-of-sight to an engagement of the corresponding first and second terminal ends 111 and 121, a sensor 152 displaced from the enclosures 130 and coupled to each of the optical elements 151 and configured to determine when any of the optical elements 151 senses or is about to sense an arc between the corresponding first and second terminal ends 111 and 121 and fiber optic cables 153. Each of the fiber optic cables 153 is connected to a corresponding one of the optical elements 151 and is routed along at least one of the corresponding first and second conductors 110 and 120. As shown in FIG. 6, each of the optical elements 151 is communicative with the sensor 152 by way of the corresponding one of the fiber optic cables 153. As shown in FIG. 6, each of the fiber optic cables 153 is connected to a same channel 1520 of the sensor 152 and includes an electrical element 620 that is configured to identify the corresponding one of the optical elements 151 to the sensor 152 by operating in a similar manner as the electrical elements 420 described above (see FIG. 4).

Technical effects and benefits of the present disclosure are the provision of arc detection in enclosures in various technologies including, but not limited to, aerospace technologies, industrial boxes, electric vehicles (e.g., trains, boats, submarines, road vehicles and flying vehicles). The arc detection provides herein offers an essential solution in the development of electric and hybrid aircraft to a safety concern that is raised when high-voltages are used especially at high altitudes.

The corresponding structures, materials, acts, and equivalents of all means or step-plus function elements in the claims below are intended to include any structure, material, or act for performing the function in combination with other claimed elements as specifically claimed. The description of the present disclosure has been presented for purposes of illustration and description, but is not intended to be exhaustive or limited to the technical concepts in the form disclosed. Many modifications and variations will be apparent to those of ordinary skill in the art without departing from the scope and spirit of the disclosure. The embodiments were chosen and described in order to best explain the principles of the disclosure and the practical application, and to enable others of ordinary skill in the art to understand the disclosure for various embodiments with various modifications as are suited to the particular use contemplated.

While the preferred embodiments to the disclosure have been described, it will be understood that those skilled in the art, both now and in the future, may make various improvements and enhancements which fall within the scope of the claims which follow. These claims should be construed to maintain the proper protection for the disclosure first described.

What is claimed is:

1. An arc detection assembly, comprising:
   a first conductor comprising a first terminal end;
   a second conductor comprising a second terminal end;
   an enclosure to partially enclose a space in which the first and second terminal ends are engageable to form an electrical connection; and
   an optical detection system comprising:
      an optical element within the enclosure with a line-of-sight to an engagement of the first and second terminal ends; and
      a sensor displaced from the enclosure and coupled to the optical element, the sensor being configured to determine when the optical element senses an arcing condition between the first and second terminal ends.

2. The arc detection assembly according to claim 1, wherein the first and second terminal ends are engageable in at least one of a pin-and-socket formation and a terminal lug formation.

3. The arc detection assembly according to claim 1, wherein the optical element comprises a lens configured to receive arc light from multiple angles.

4. The arc detection assembly according to claim 3, wherein the sensor comprises at least one of an optical sensor, an infrared sensor and an ultraviolet sensor.

5. The arc detection assembly according to claim 1, wherein:
   the sensor is a component of a controller, the controller being configured to identify and interrupt an arc causing current and to issue an arcing warning, and the arc detection assembly further comprises an electrical device configured to open a circuit carrying the current responsive to an interrupt signal issued by the controller.

6. The arc detection assembly according to claim 1, wherein the optical detection system comprises a fiber optic cable routed along at least one of the first and second conductors and by which the optical element and the sensor are communicative.

7. An arc detection assembly, comprising:
electrical connections, each comprising:
a first conductor comprising a first terminal end;
a second conductor comprising a second terminal end; and
an enclosure to partially enclose a space in which the first and second terminal ends are engageable to form an electrical connection; and
an optical detection system comprising:
optical elements, each within one of the enclosures with a line-of-sight to an engagement of the corresponding first and second terminal ends;
a sensor displaced from the enclosures and coupled to each of the optical elements, the sensor being configured to determine when any of the optical elements senses an arcing condition between the corresponding first and second terminal ends; and
a fiber optic cable routed along at least one of the first and second conductors of each of the electrical connections and by which each of the optical elements and the sensor are communicative.

8. The arc detection assembly according to claim 7, wherein the first and second terminal ends in at least one of the electrical connections are engageable in at least one of a pin-and-socket formation and a terminal lug formation.

9. The arc detection assembly according to claim 7, wherein each of the optical elements comprises a lens configured to receive arc light from multiple angles.

10. The arc detection assembly according to claim 9, wherein the sensor comprises at least one of an optical sensor, an infrared sensor and an ultraviolet sensor.

11. The arc detection assembly according to claim 7, wherein:
the sensor is a component of a controller, the controller being configured to identify and interrupt an arc causing current and to issue an arcing warning, and
the arc detection assembly further comprises an electrical device configured to open a circuit carrying the current responsive to an interrupt signal issued by the controller.

12. The arc detection assembly according to claim 7, further comprising electrical elements electrically interposed between the fiber optic cable and a corresponding one of the optical elements and configured to identify the corresponding one of the optical elements to the sensor.

13. An arc detection assembly, comprising:
electrical connections, each comprising:
a first conductor comprising a first terminal end;
a second conductor comprising a second terminal end; and
an enclosure to partially enclose a space in which the first and second terminal ends are engageable to form an electrical connection; and
an optical detection system comprising:
optical elements, each within one of the enclosures with a line-of-sight to an engagement of the corresponding first and second terminal ends; and
a sensor displaced from the enclosures and coupled to each of the sensors, the sensor being configured to determine when any of the optical elements senses an arcing condition between the corresponding first and second terminal ends.

14. The arc detection assembly according to claim 13, wherein the first and second terminal ends in at least one of the electrical connections are engageable in at least one of a pin-and-socket formation and a terminal lug formation.

15. The arc detection assembly according to claim 13, wherein each of the optical elements comprises a lens configured to receive arc light from multiple angles.

16. The arc detection assembly according to claim 15, wherein the sensor comprises at least one of an optical sensor, an infrared sensor and an ultraviolet sensor.

17. The arc detection assembly according to claim 13, wherein:
the sensor is a component of a controller, the controller being configured to identify and interrupt an arc causing current and to issue an arcing warning, and
the arc detection assembly further comprises an electrical device configured to open a circuit carrying the current responsive to an interrupt signal issued by the controller.

18. The arc detection assembly according to claim 13, wherein:
the optical detection system comprises fiber optic cables each connected to a corresponding one of the optical elements, and
each of the fiber optic cables is routed along at least one of the corresponding first and second conductors.

19. The arc detection assembly according to claim 18, wherein each of the optical elements is communicative with a unique channel of the sensor by way of the corresponding one of the fiber optic cables.

20. The arc detection assembly according to claim 18, wherein:
each of the optical elements is communicative with the sensor by way of the corresponding one of the fiber optic cables, and
each of the fiber optic cables is connected to a same channel of the sensor and comprises an electrical element configured to identify the corresponding one of the optical elements to the sensor.

* * * * *